US010140398B2

(12) United States Patent
Kim (10) Patent No.: US 10,140,398 B2
(45) Date of Patent: Nov. 27, 2018

(54) AUTOMATIC GENERATION SYSTEM OF REBAR SHOP DRAWING USING 3D MODEL

(71) Applicant: Industry-Academic Cooperation Foundation, Dankook University, Yongin-si, Gyeonggi-do (KR)

(72) Inventor: Chee Kyeong Kim, Seoul (KR)

(73) Assignee: Industry-Academic Cooperation Foundation, Dankook University, Yongin-si, Gyeonggi-do (KR)

( * ) Notice: Subject to any disclaimer, the term of this patent is extended or adjusted under 35 U.S.C. 154(b) by 96 days.

(21) Appl. No.: 15/307,449

(22) PCT Filed: Jul. 27, 2016

(86) PCT No.: PCT/KR2016/008232
§ 371 (c)(1),
(2) Date: Oct. 28, 2016

(87) PCT Pub. No.: WO2017/018807
PCT Pub. Date: Feb. 2, 2017

(65) Prior Publication Data
US 2017/0185704 A1 Jun. 29, 2017

(30) Foreign Application Priority Data
Jul. 30, 2015 (KR) .................. 10-2015-0107690

(51) Int. Cl.
*G06T 19/20* (2011.01)
*G06F 17/50* (2006.01)
(Continued)

(52) U.S. Cl.
CPC .......... *G06F 17/5009* (2013.01); *G06F 17/50* (2013.01); *G06F 17/5004* (2013.01);
(Continued)

(58) Field of Classification Search
None
See application file for complete search history.

(56) References Cited

U.S. PATENT DOCUMENTS 7,212,197 B1 * 5/2007 Schkolne ............... G06T 19/20
345/419
8,564,590 B2 * 10/2013 Wu .......................... G06T 19/00
345/419
(Continued)

FOREIGN PATENT DOCUMENTS

KR 10-1163580 B1 7/2012
KR 10-1473956 B1 12/2014

OTHER PUBLICATIONS

Chee Kyeong Kim et al., "Rebar Detail Design and Construction Management Based on BIM", Building construction, Mar. 2015, pp. 69-73, vol. 15, No. 1.
(Continued)

*Primary Examiner* — Said Broome
(74) *Attorney, Agent, or Firm* — Rabin & Berdo, P.C.

(57) ABSTRACT

Disclosed is an automatic generation system of a rebar shop drawing using a three-dimensional model capable of rapidly creating a 2D rebar shop drawing including member reinforcement information and boundary region reinforcement information from the 2D structure drawing or 3D building information modeling data. The automatic generation system of a rebar shop drawing using a 3D model, the system including: a structure drawing processor configured to receive 2D structure drawing data where a member group is applied for every member; a member information processor configured to extract section information by member groups from member schedule data including section information and member reinforcement information of each member group and boundary region reinforcement information of
(Continued)

each boundary region group by receiving the member schedule data; a 3D modeling processor configured to match the section information by members extracted from the member information processor with each member of the 2D structure drawing data received by the structure drawing processor to obtain a modeled 3D drawing; a boundary region information extractor configured to extract boundary region information of each member from the modeled 3D drawing from the 3D modeling processor; a boundary region information matching processor configured to match the extracted boundary region information of each member from the boundary region information extractor with each member of the 2D structure drawing data to allocate the matching result; a reinforcement information processor configured to generate rebar shop drawing data by matching the member reinforcement information of each member group and the boundary region reinforcement information of each boundary region group from the member schedule data with each member to which boundary region information of the 2D structure drawing data is allocated; and a rebar shop drawing creator configured to create and display a rebar shop drawing of a member selected by a user from the 2D structure drawing data storing reinforcement information of a member and a boundary region by the reinforcement information processor.

24 Claims, 11 Drawing Sheets

(51) Int. Cl.
*G06Q 50/08* (2012.01)
*G06K 9/46* (2006.01)
*G06K 9/62* (2006.01)
*G06T 15/20* (2011.01)
*G06K 9/00* (2006.01)
*G06T 11/00* (2006.01)

(52) U.S. Cl.
CPC ....... *G06K 9/00476* (2013.01); *G06K 9/4604* (2013.01); *G06K 9/6202* (2013.01); *G06Q 50/08* (2013.01); *G06T 11/00* (2013.01); *G06T 15/205* (2013.01); *G06T 19/20* (2013.01); *G06T 2200/24* (2013.01); *G06T 2219/2012* (2013.01); *G06T 2219/2016* (2013.01)

(56) References Cited

U.S. PATENT DOCUMENTS

| | | | |
|---|---|---|---|
| 2006/0044307 A1* | 3/2006 | Song | G06Q 10/06 345/419 |
| 2007/0109310 A1* | 5/2007 | Xu | G06T 15/02 345/581 |
| 2013/0155058 A1* | 6/2013 | Golparvar-Fard | G06T 19/006 345/419 |
| 2013/0328872 A1* | 12/2013 | Suomi | G06T 17/20 345/420 |

OTHER PUBLICATIONS

Chee Kyeong Kim, "3D Rebar Shop Program Based on BIM", Information Board, Sep. 2013, pp. 58-61, vol. 26, No. 3.
Hyun-Chul Choi et al., "Development of 3-Dimensional Rebar Detail Design and Placing Drawing System", J. Comput. Struct. Eng. Inst. Korea, Aug. 2014, pp. 289-296, vol. 27, No. 4.
Byeong Kwun Lee et al., "3D Rebar Placing and Drawing System", J. Comput. Struct. Eng. Inst. Korea, 2010, pp. 529-532.
International Search Report of PCT/KR2016/008232 dated Jul. 27, 2016.

* cited by examiner

| REBAR | COLOR OF REBAR | YIELD STRENGTH | ORDER LENGTH |
|---|---|---|---|
| HD10 | Magenta | SD40 | 8000 |
| HD13 | Yellow | SD40 | 8000 |
| HD16 | Green | SD40 | 8000 |
| HD19 | Cyan | SD40 | 8000 |
| HD22 | White | SD40 | 8000 |
| HD25 | Red | SD40 | 8000 |
| HD29 | Magenta | SD40 | 8000 |
| HD32 | Yellow | SD40 | 8000 |
| HD35 | Green | SD40 | 8000 |
| HD38 | Cyan | SD40 | 8000 |
| HD41 | White | SD40 | 8000 |

REBAR STRENGTH AND ORDER LENGTH SETTING

ENTER    CANCEL

FIG. 4

| MEMBER | | COMPENSATION NUMBER | REMARKS |
|---|---|---|---|
| MAT | | 100 | |
| COLUMN | | 10 | |
| WALL | VERTICAL | 10 | |
| | HORIZONTAL | 10 | ☐ 50 ROUND OFF |
| UNDERGROUND OUTER WALL | VERTICAL | 10 | |
| | HORIZONTAL | 10 | |
| BEAM | | 100 | |
| SLAB | | 100 | |

MODIFIED LENGTH

ENTER   CANCEL

FIG. 5

| Dowel | |
|---|---|
| Name | W3 |
| FoundationThick | 900 |
| Bot Cover | 80 |
| Side Cover | 40 |
| End Cover | 50 |
| Start Spacing | Cover |
| End Spacing | Cover |
| Start EndBar | No |
| End EndBar | No |
| View Data | Yes |
| View Dim | No |
| View TextPosition | No |

AUTOMATIC GENERATION SYSTEM OF REBAR SHOP DRAWING USING 3D MODEL

TECHNICAL FIELD

The present invention relates to an automatic generation system of a rebar shop drawing using a three-dimensional (hereinafter referred to as '3D') model capable of rapidly creating a two-dimensional (hereinafter referred to as '2D') rebar shop drawing including member reinforcement information and boundary region reinforcement information from a 2D structure drawing or 3D building information modeling (hereinafter referred to as 'BIM') data.

BACKGROUND ART

A reinforced concrete structure may ensure sufficient deformation performance and resistance after a concrete is cracked by reinforcing respective members such as a column, a beam, and a slab with a rebar having high tensile strength.

The rebar serves to reinforce tensile force which is a disadvantage of a concrete. The rebar is disconnected in the respective members but is not independently disposed and is mutually reinforced to be settled with each other through an adjacent different member. Further, since there are limitations in a length of an original rebar, if a length of a member is great, a plurality of rebars should be used through connection.

There are various cases in concrete reinforcement according to deviation, steps, and opening reinforcement of the member as well as the above development and splice of the rebar.

Meanwhile, a design of reinforcement according to the related art uses a method of configuring a rebar shop drawing and a processing schedule table by reinforcement regions using a 2D CAD program based on a structure plan view and a member section schedule table (Korean Patent No. 10-1163580, etc.).

Further, during the above procedure, a designer determines a shape of the rebar to repeat a placement operation of the rebar in a drawing by taking into consideration a length, development, and splice of an original rebar, and eccentric and steps of the member.

Accordingly, since the designer should individually recognize adjacent members for every member in a structure drawing to analyze a boundary region with other member, that is, a type of a joint part, it inevitably takes a long time to design the reinforcement.

In addition, when the designer wrongly understands the structure drawing or wrongly selects a type of a joint part, failure may occur in the rebar shop drawing.

That is why attributes are discontinuously defined for every member in a member section schedule table but respective members are continuously connected to each other in an actual structure so that a concrete reinforcement design in a continuous boundary region is complicated and individual.

Moreover, when section information of a certain member is changed due to design change and the like, the reinforcement details of the boundary region with respect to all members close to the certain member should be changed together. However, it takes a long time and the possibility of omission or wrong correction is great for the designer to individually change the reinforcement details of the boundary region. Accordingly, all relation drawings may be recreated.

For example, four upper and lower beams and two upper and lower slabs are coupled with an adjacent member in one a column member. When the section size or reinforcement information of the column member is changed, the details of ten boundaries should be changed.

Accordingly, in recent years, technologies of automatically creating a rebar shop drawing using BIM information have been developed.

Such an automatic concrete reinforcing system creates a 3D rebar shop drawing. The automatic concrete reinforcing system may precisely calculate an amount of a rebar and may increase design precision by easily confirming reinforcement errors. In addition, when a design is changed, the reinforcement state of the whole building may be simultaneously corrected so that usage is easy upon calculating an estimate and an amount at a step before construction. Furthermore, since a practical construction process may be simulated, the automatic concrete reinforcing system is advantageous in terms of process management and calculation of amounts by airs.

However, since the above technology is basically achieved for the purpose of creating a 3D rebar shop drawing, a worker has a difficulty in using the technology in a field. In addition, since the 2D rebar shop drawing is extracted from a relatively complicated 3D rebar shop drawing with a massive amount of data even if a 2D drawing is extracted from the 3D rebar shop drawing, a process is complicated and there is a limitation on a processing rate.

DISCLOSURE

Technical Problem

The present invention provides an automatic generation system of a rebar shop drawing using a 3D model capable of rapidly generating a 2D rebar shop drawing including member reinforcement information and boundary region reinforcement information from a 2D structure drawing or 3D BIM data.

The present invention provides an automatic generation system of a rebar shop drawing using a 3D model capable of simply correcting a reinforcement state of the whole building when a design is changed because adjacent member information may be corrected in connection with change in section information of a partial member when the section information of a partial member is changed.

Technical Solution

In accordance with an aspect of the present invention, there is provided an automatic generation system of a rebar shop drawing using a 3D model, the system including: a structure drawing processor configured to receive two-dimensional (2D) structure drawing data where a member group is applied for every member; a member information processor configured to extract section information by member groups from member schedule data including section information and member reinforcement information of each member group and boundary region reinforcement information of each boundary region group by receiving the member schedule data; a 3D modeling processor configured to match the section information by members extracted from the member information processor with each member of the 2D structure drawing data received by the structure drawing processor to obtain a modeled 3D drawing; a boundary region information extractor configured to extract boundary region information of each member from the modeled 3D drawing from the 3D modeling processor; a boundary region information matching processor configured to match the extracted boundary region information of each member from the boundary region information extractor with each member of the 2D structure drawing data to allocate the matching result; a reinforcement information processor configured to generate rebar shop drawing data by matching the member reinforcement information of each member group and the boundary region reinforcement information of each boundary region group from the member schedule data with each member to which boundary region information of the 2D structure drawing data is allocated; and a rebar shop drawing creator configured to create and display a rebar shop drawing of a member selected by a user from the 2D structure drawing data storing reinforcement information of a member and a boundary region by the reinforcement information processor.

In accordance with another embodiment of the present invention, there is provided an automatic generation system of a rebar shop drawing using a three-dimensional (3D) model, the system including: a boundary region information extractor configured to receive 3D building information modeling (BIM) data to extract boundary region information of each member from the 3D BIM data; a boundary region information matching processor configured to match the extracted boundary region information of each member from the boundary region information extractor with each member of two-dimensional (2D) structure drawing data where a member group is applied for every member to allocate the matching result; a reinforcement information processor configured to create rebar shop drawing data by matching the member reinforcement information of each member group and the boundary region reinforcement information of each boundary region group from the member schedule data including section information and member reinforcement information of each member group and boundary region reinforcement information of each boundary region group with each member to which the boundary region information of the 2D structure drawing data is allocated; and a rebar shop drawing creator configured to create and display a rebar shop drawing of a member selected by a user from the 2D structure drawing data storing reinforcement information of a member and a boundary region by the reinforcement information processor.

The reinforcement information processor may include a rebar division setting option having a color changed according to a diameter of a rebar.

The reinforcement information processor may include a construction option setting unit configured to control a length of a rebar.

The construction option setting unit may include an order length setting option capable of setting an order length by diameters and yield strengths of the rebar.

The construction option setting unit may include a modified length setting option for modifying a length of the rebar as a standardized length.

The construction option setting unit may include a coating thickness setting option by setting a coating thickness by member groups to be reflected on the rebar shop drawing data.

The construction option setting unit may include an development and splice length setting option configured to set an development and splice length by member groups to be reflected on the rebar shop drawing data.

The construction option setting unit may include a dowel setting option configured to set a dowel anchoring method of a vertical member to be reflected on the rebar shop drawing data.

The reinforcement information processor may include a reinforcement option setting unit configured to control a shape of a rebar.

The reinforcement option setting unit may include a splice scheme setting option configured to set a rebar splice scheme to be reflected on the rebar shop drawing data.

The reinforcement option setting unit may include an anchorage scheme setting option configured to set a rebar anchoring scheme to be reflected on the rebar shop drawing data.

The reinforcement option setting unit may include a hoop shape setting option configured to set a column hoop shape bonded to the beam to be reflected on the rebar shop drawing data.

Advantageous Effects

The present invention has following effects.

First, a 2D rebar shop drawing including boundary region reinforcement information as well as member reinforcement information can be rapidly created from a 2D structure drawing by matching adjacent member information and boundary region information with an adjacent member with each member in the 2D structure drawing after modeling the 2D structure drawing as a 3D drawing to automatically extract adjacent member information of each member from the 3D drawing.

Second, a 2D rebar shop drawing including member reinforcement information and boundary region reinforcement information can be rapidly created by matching the extracted boundary region information of each member with each member of 2D structure drawing data after extracting the boundary region information of each member from the 3D BIM data.

Third, since adjacent member information may be corrected in connection with change in section information of a partial member when the section information of a partial member is changed, a reinforcement state of the whole building can be simply corrected when a design is changed.

Fourth, when a reinforcement information processor includes a rebar division setting option, a color of a rebar displayed by a rebar shop drawing creator may be changed according to a diameter of a rebar. Accordingly, a worker may easily recognize a diameter of the rebar so that a working efficiency is improved.

Fifth, when a construction option setting unit or a reinforcement option setting unit is included in the reinforcement information processor, a user can reflect various rebar options on a rebar shop drawing according to construction convenience or a construction method.

BEST MODE

In order to achieve the above objective, an automatic generation system of a rebar shop drawing using a 3D model according to the present invention includes: a structure drawing processor configured to receive 2D structure drawing data where a member group is applied for every member; a member information processor configured to extract section information by member groups from member schedule data including section information and member reinforcement information of each member group and boundary region reinforcement information of each boundary region group by receiving the member schedule data; a 3D modeling processor configured to match the section information by members extracted from the member information processor with each member of the 2D structure drawing data received by the structure drawing processor to obtain a modeled 3D drawing; a boundary region information extractor configured to extract boundary region information of each member from the modeled 3D drawing from the 3D modeling processor; a boundary region information matching processor configured to match the extracted boundary region information of each member from the boundary region information extractor with each member of the 2D structure drawing data to allocate the matching result; a reinforcement information processor configured to generate rebar shop drawing data by matching the member reinforcement information of each member group and the boundary region reinforcement information of each boundary region group from the member schedule data with each member to which boundary region information of the 2D structure drawing data is allocated; and a rebar shop drawing creator configured to create and display a rebar shop drawing of a member selected by a user from the 2D structure drawing data storing reinforcement information of a member and a boundary region by the reinforcement information processor.

Hereinafter, the exemplary embodiment of the present invention will be described with reference to the accompanying drawings.

Figure 1:
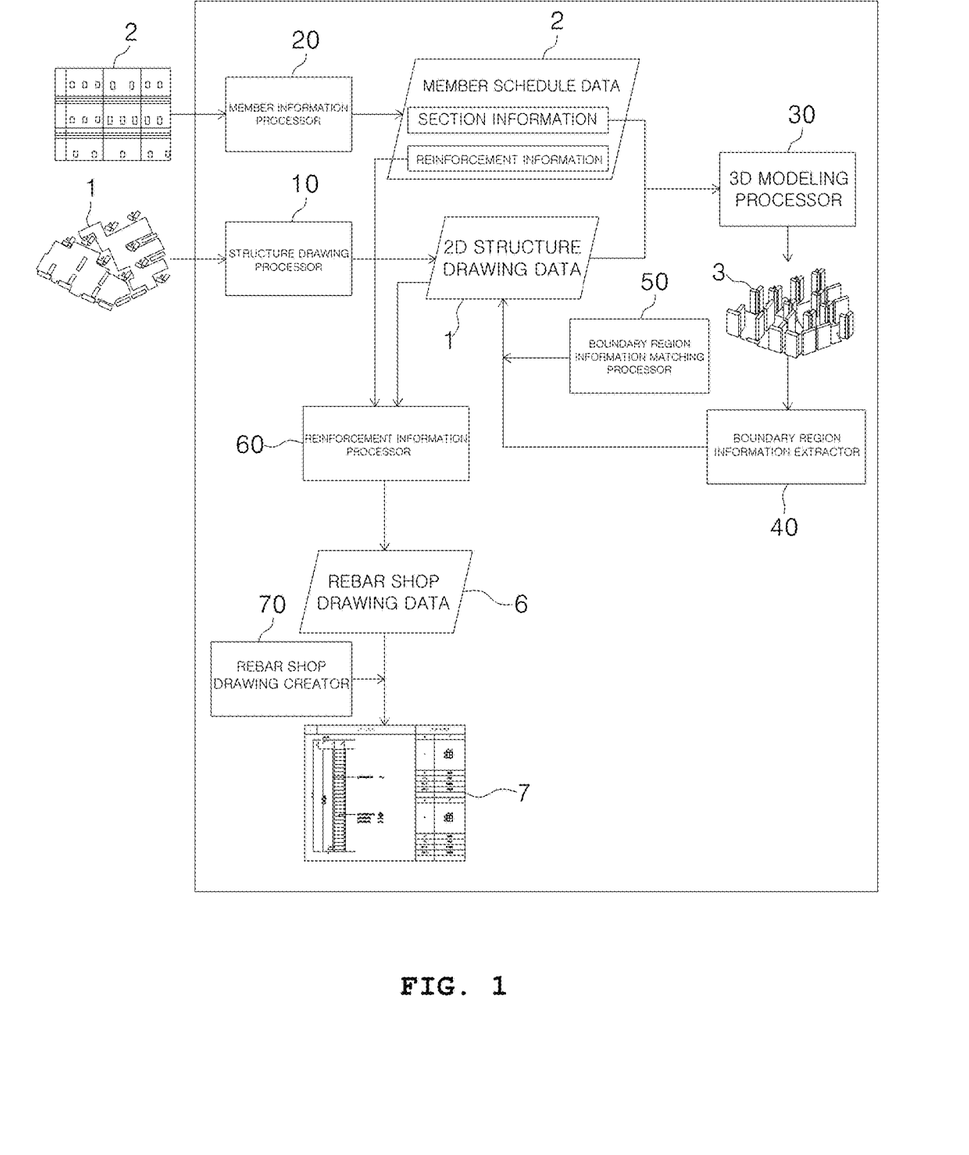
FIG. 1 is a block diagram illustrating a configuration of an automatic generation system of a rebar shop drawing using a 3D model according to an embodiment of the present invention.

FIG. 1 is a block diagram illustrating a configuration of an automatic generation system of a rebar shop drawing using a 3D model according to an embodiment of the present invention.

As shown in FIG. 1, an automatic generation system of a rebar shop drawing using a 3D model may include: a structure drawing processor 10 configured to receive 2D structure drawing data 1 where a member group is applied for every member; a member information processor 20 configured to extract section information by member groups from member schedule data 2 including section information and member reinforcement information of each member group and boundary region reinforcement information of each boundary region group by receiving the member schedule data 2; a 3D modeling processor 30 configured to match the section information by members extracted from the member information processor 20 with each member of the 2D structure drawing data 1 received by the structure drawing processor 10 to obtain a modeled 3D drawing 3; a boundary region information extractor 40 configured to extract boundary region information of each member from the modeled 3D drawing 3 from the 3D modeling processor 30; a boundary region information matching processor 50 configured to match the extracted boundary region information of each member from the boundary region information extractor 40 with each member of the 2D structure drawing data 1 to allocate the matching result; a reinforcement information processor 60 configured to generate rebar shop drawing data 6 by matching the member reinforcement information of each member group and the boundary region reinforcement information of each boundary region group from the member schedule data 2 with each member to which boundary region information of the 2D structure drawing data 1 is allocated; and a rebar shop drawing creator 70 configured to create and display a rebar shop drawing 7 of a member selected by a user from the 2D structure drawing data 1 storing reinforcement information of a member and a boundary region by the reinforcement information processor 60.

The 2D structure drawing data 1 are input to the structure drawing processor 10.

In this case, the 2D structure drawing data 1 means a structure plan view.

The member information processor 20 receives the member schedule data 2 to extract section information by member groups from the member schedule data 2.

The member schedule data 2 includes section information and member reinforcement information of each member group and boundary region reinforcement information of each boundary region group.

For example, the member group may include a beam, a column, a slab, and the like.

Further, section information of the beam may include geometric information such as a width, a size, and a length of the beam, information on a connection beam, and information on a lower support member as an example of section information of the member group.

Moreover, section information of the column may include geometric information such as a size, a height, and a size of the column, and information on presence of an upper column, an eccentric length of the upper column, a thickness of a lower support member, and a thickness of an upper horizontal member.

In addition, section information of the wall may include geometric information such as a thickness, a length, and a height, and information on a thickness of a lower support member, presence of an upper wall, an eccentric length of the upper wall, and a thickness of an upper horizontal member.

The 3D modeling processor 30 matches the section information by member groups extracted from the member information processor 20 with each member of the 2D structure drawing data 1 received by the structure drawing processor 10 to obtain a modeled 3D drawing 3.

Since the 2D structure drawing data 1, that is, a structure plan view includes only plane information of each member, there is no vertical direction information so that 3D modeling is impossible.

Accordingly, the 3D modeling processor 30 adds section information in the member schedule data 2 to the 2D structure drawing data 1 to obtain the modeled 3D drawing 3.

Further, the boundary region information extractor 40 extracts boundary region information of each member from the modeled 3D drawing 3 from the 3D modeling processor 30.

The boundary region means a coupled region of each member such as the beam, the column, and the wall with an adjacent member.

The boundary region information extractor 40 recognizes an adjacent member close to a specific member to extract detailed information such as a shape or a size from the recognized adjacent member.

The boundary region information matching processor 50 matches the extracted boundary region information of each member from the boundary region information extractor 40 with each member of the 2D structure drawing data 1 to allocate the matching result to the 2D structure drawing data 1.

The boundary region information matching processor 50 creates rebar shop drawing data 6 by matching member reinforcement information by member groups and boundary region reinforcement information by boundary region groups from the member schedule data 2 with each member to which boundary region information of the 2D structure drawing data 1 is allocated. The rebar shop drawing creator 70 creates and displays a rebar shop drawing 7 of a member selected by a user from the 2D structure drawing data 1 storing reinforcement information of a member and a boundary region by the reinforcement information processor 60.

As described above, the present invention extracts and matches section information of each member group from the member schedule data 2 with the 2D structure drawing data 1 to obtain a modeled 3D drawing 3, and automatically extracts adjacent member information of each member from the modeled 3D drawing 3.

Further, the present invention may automatically, rapidly, and exactly create a rebar shop drawing 7 including boundary information by again matching the adjacent member information and boundary region information of the adjacent member with each member in the 2D structure drawing data 1 to automatically create the rebar shop drawing 7 from the matching result.

That is, since the 2D rebar shop drawing 7 is automatically created from the 2D structure drawing instead of extracting the 2D rebar shop drawing from the 3D reinforcement drawing, the rebar shop drawing 7 may be very rapidly created.

In addition, when the 2D structure drawing data 1 is corrected in order to change section information of partial members, adjacent member information is automatically corrected in connection with the correction of the 2D structure drawing data 1 to be reflected on the rebar shop drawing 7 so that a correction operation is simple and exact.

Figure 2:
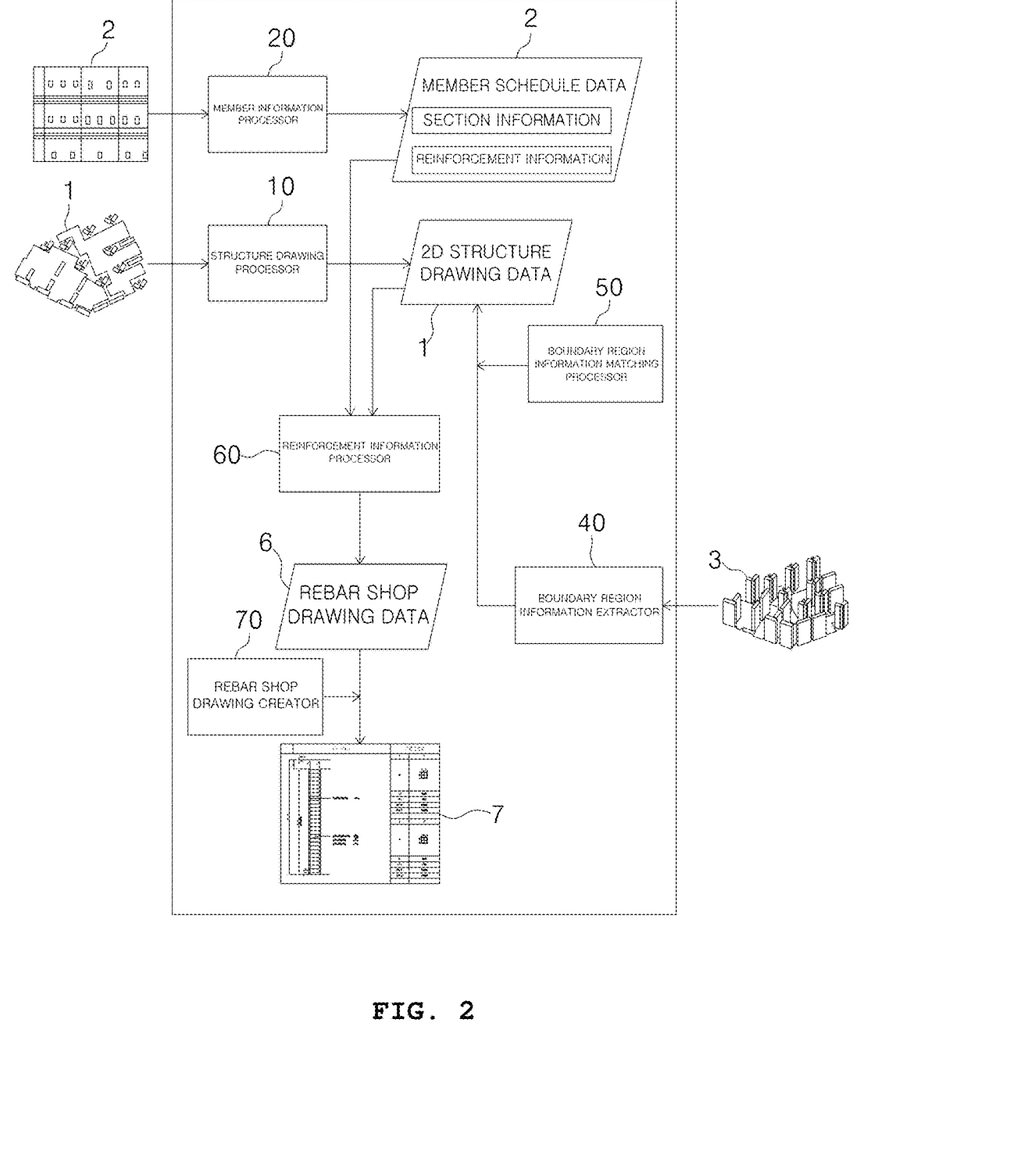
FIG. 2 is a block diagram illustrating a configuration of an automatic generation system of a rebar shop drawing using a 3D model according to another embodiment of the present invention.

FIG. 2 is a block diagram illustrating a configuration of an automatic generation system of a rebar shop drawing using a 3D model according to another embodiment of the present invention.

As shown in FIG. 2, an automatic generation system of a rebar shop drawing using a 3D model may include: a boundary region information extractor 40 configured to receive 3D BIM data to extract boundary region information of each member from the 3D BIM data; a boundary region information matching processor 50 configured to match the extracted boundary region information of each member from the boundary region information extractor 40 with each member of the 2D structure drawing data 1 where a member group is applied for every member to allocate the matching result; a reinforcement information processor 60 configured to create rebar shop drawing data 6 by matching the member reinforcement information of each member group and the boundary region reinforcement information of each boundary region group from the member schedule data 2 including section information and member reinforcement information of each member group and boundary region reinforcement information of each boundary region group with each member to which the boundary region information of the 2D structure drawing data 1 is allocated; and a rebar shop drawing creator 70 configured to create and display a rebar shop drawing 7 of a member selected by a user from the 2D structure drawing data 1 storing reinforcement information of a member and a boundary region by the reinforcement information processor 60.

FIG. 2 illustrates an applicable embodiment when 3D BIM data according to the related art designing a structure as a 3D model is used.

Accordingly, unlike the example of FIG. 1, there are no needs to model the 2D structure drawing data 1 by the 3D drawing 3.

The automatic generation system of a rebar shop drawing using a 3D model extracts and matches only boundary region of each member from 3D BIM data with each member of the 2D structure drawing data 1, and automatically creates the rebar shop drawing 7 including boundary region information by automatically creating the rebar shop drawing 7 from the matching result.

Figure 3:
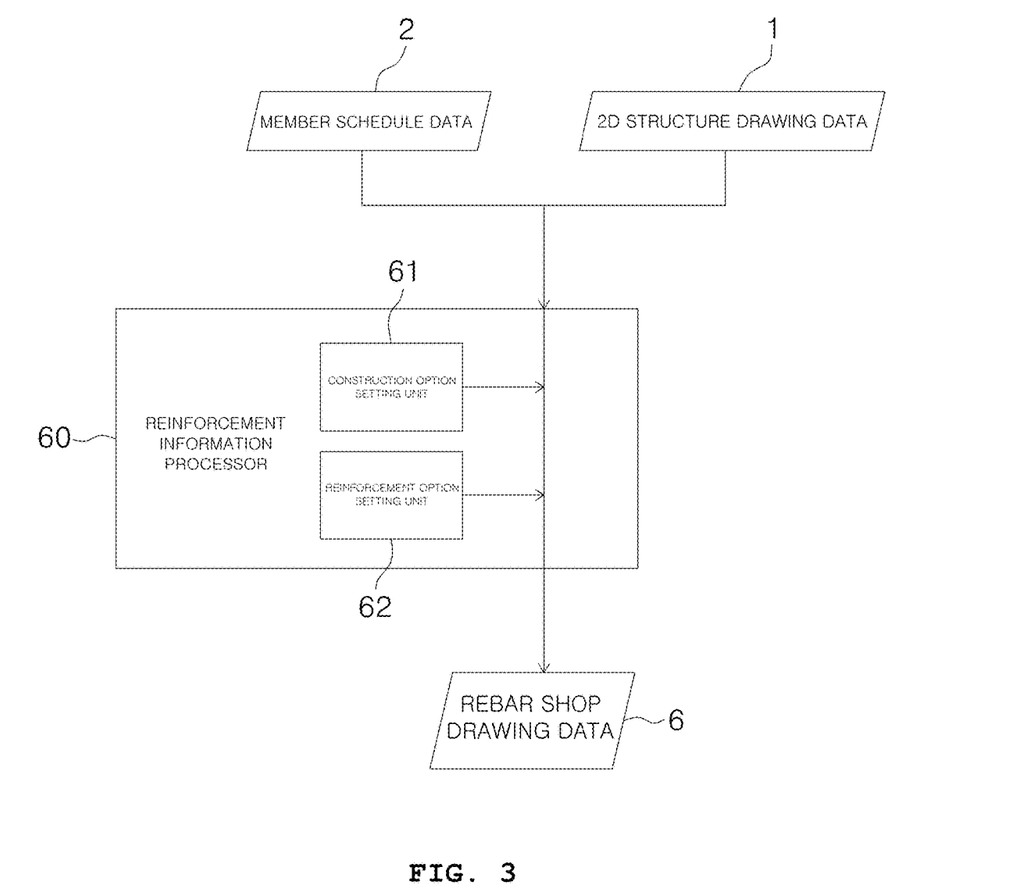
FIG. 3 is a block diagram illustrating a configuration of a reinforcement information processor.

FIG. 3 is a block diagram illustrating a configuration of a reinforcement information processor.

The reinforcement information processor 60 may include a construction option setting unit 61 configured to control a length of a rebar.

According to the related art, a worker should input various construction options by direct calculation applied when a length of a rebar is changed according to a construction convenience or a construction method such as an order length, a modified length, a coating thickness, and development and splice length of the rebar, an additional length of an auxiliary hoop, and a dowel anchoring method of a vertical member. Accordingly, an operation reflecting various construction options is inconvenient so that an error possibility may occur.

Accordingly, in the present invention, if a user selects a construction option through the construction optional setting unit 61, the construction option may be reflected on the details of a rebar construction.

For example, the construction option includes order lengths by diameters and yield strengths of a rebar, a modified length of the rebar, a coating thickness by member groups, development and splice lengths by member groups, and a dowel anchoring method of a vertical member. Each construction option will be described later with reference to FIG. 4 to FIG. 8.

The reinforcement information processor 60 may further include a reinforcement option setting unit 62 configured to control a shape of the rebar.

The reinforcement option may be automatically reflected on the construction details of the rebar if a user selects a rebar splice scheme, a rebar development scheme, and a hoop shape of a column bonded to a beam as a case of changing a shape of the rebar according to a construction convenience or a construction method.

Accordingly, the reinforcement option setting unit 62 may include a splice scheme setting option which sets a rebar splice scheme to be reflected on the rebar shop drawing data 6.

That is, a rebar splice scheme such as lap splice, coupler splice, and gas welding splice may be selected from a splice scheme setting option to be reflected on the rebar shop drawing data 6.

Further, the reinforcement option setting unit 62 may include an anchorage scheme setting option which sets a rebar anchoring scheme to be reflected on the rebar shop drawing data 6.

That is, a rebar setting scheme such as a 90° standard hook and single anchorage may be selected from the splice scheme setting option to be reflected on the rebar shop drawing data 6.

The reinforcement option setting unit 62 may include a hoop shape setting option which sets a column hoop shape bonded to the beam to be reflected on the rebar shop drawing data 6.

In general, a column region bonded to a beam is a general closed hoop. When the column region is disposed, reinforcement may be difficult due to interference between an anchorage rebar and the hoop. In this case, a column hoop shape constructed by changing a column hoop shape into an amount hoop may be selected from a splice scheme setting option to be reflected on the rebar shop drawing data 6.

Figure 4:
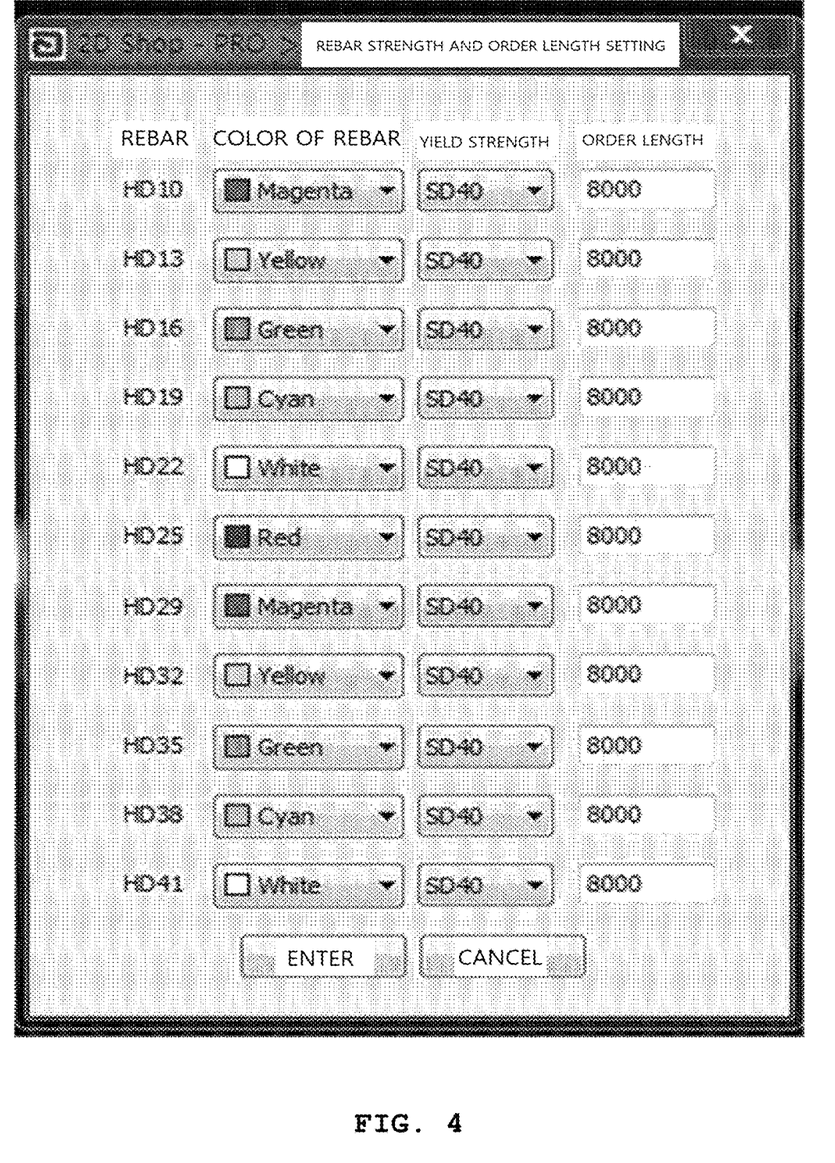
FIG. 4 is a diagram illustrating an example of an order length setting option of a construction option setting unit.

FIG. 4 is a diagram illustrating an example of an order length setting option of a construction option setting unit.

As shown in FIG. 4, the reinforcement information processor 60 may include a rebar division setting option having a color changed according to a diameter of a rebar.

In the examples of FIG. 1 and FIG. 2, the color of the rebar may be changed according to the diameter of the rebar through the rebar division setting option.

Accordingly, the color of the rebar displayed by the rebar shop drawing creator 70 may be changed according to the diameter of the rebar, and a worker may easily recognize the diameter of the rebar to increase a working efficiency.

In addition, when the reinforcement information processor 60 includes a construction option setting unit 61, the construction option setting unit 61 may include an order length setting option capable of setting an order length by diameters and yield strengths of the rebar.

In general, the order length of the rebar is 8,000 mm but may be changed by diameters and yield strengths of the rebar through the order length setting option as shown in FIG. 4.

Figure 5:
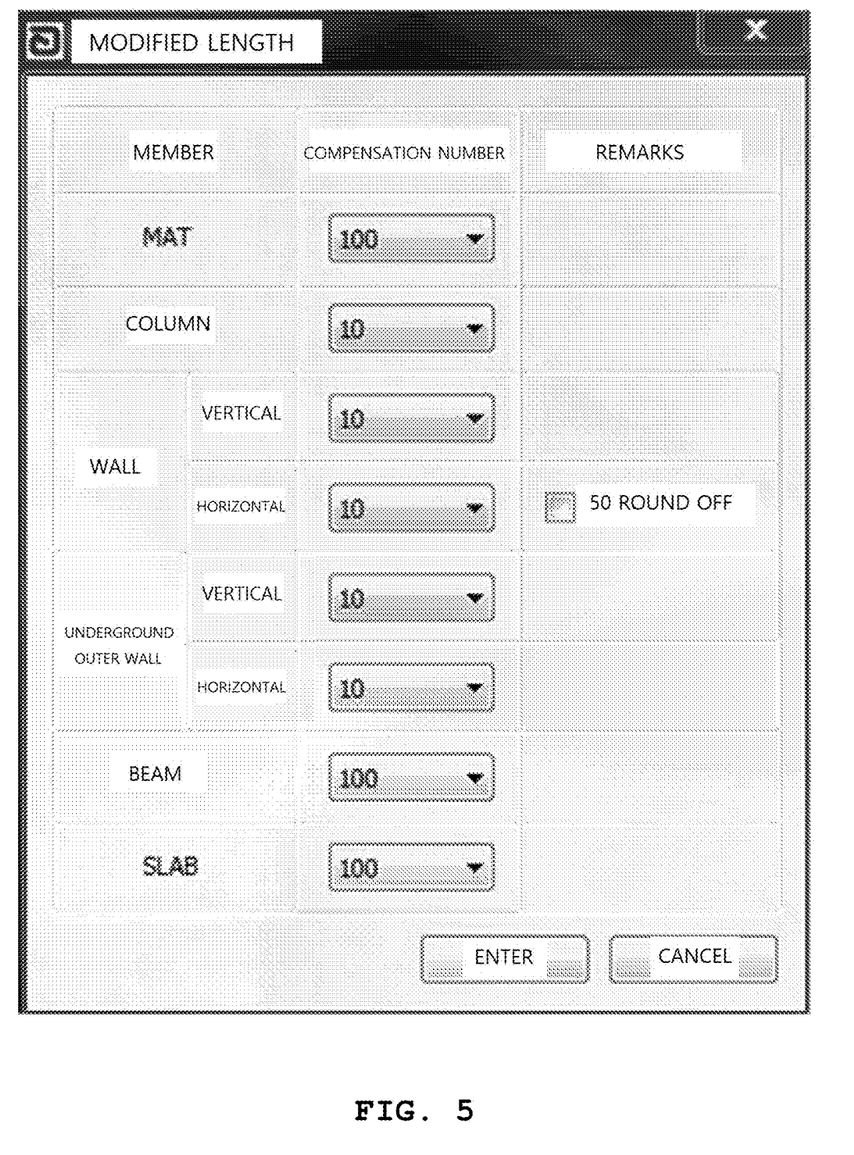
FIG. 5 is a diagram illustrating an example of a modified length setting option of a construction option setting unit.

FIG. 5 is a diagram illustrating an example of a modified length setting option of a construction option setting unit.

The construction option setting unit 61 may include a modified length setting option for modifying a length of the rebar as a standardized length.

For example, when the length of the rebar is changed as 8,420 mm, 8,460 mm, or 8,470 mm, as shown in FIG. 5, the length of the rebar may be united as 8,500 mm by modifying the length of the rebar through a modified length setting option.

Accordingly, workers may easily find and use a corresponding rebar by reducing the number of rebar shapes.

Figure 6:
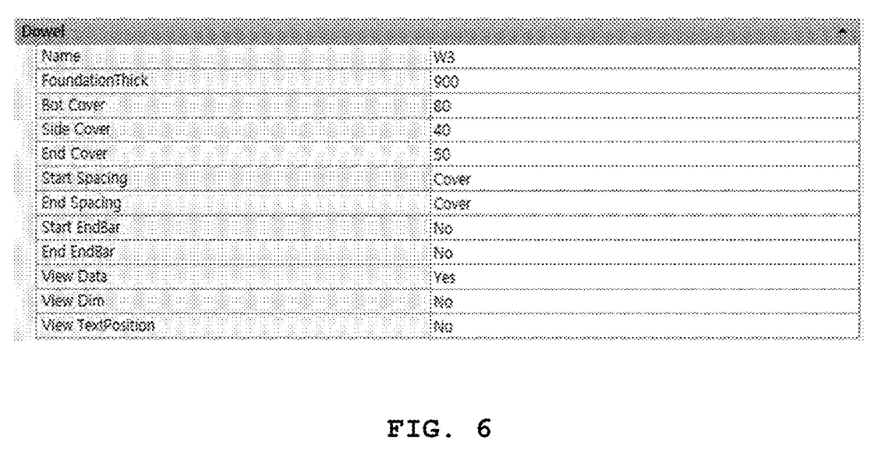
FIG. 6 is a diagram illustrating an example of a coating thickness setting option of a construction option setting unit.

FIG. 6 is a diagram illustrating an example of a coating thickness setting option of a construction option setting unit.

The construction option setting unit 61 may include a coating thickness setting option by setting a coating thickness by member groups to be reflected on the rebar shop drawing data 6.

When the coating thickness exerting influence upon bond strength of the rebar is changed, a shape and a length of a dowel, a shape and a length of a hoop, and an development length of the rebar are changed.

Accordingly, a length of the rebar including the dowel and the hoop may be automatically corrected to be reflected on the rebar shop drawing data 6 by inputting coating thickness by member groups through the coating thickness setting option as shown FIG. 6.

Figure 7:
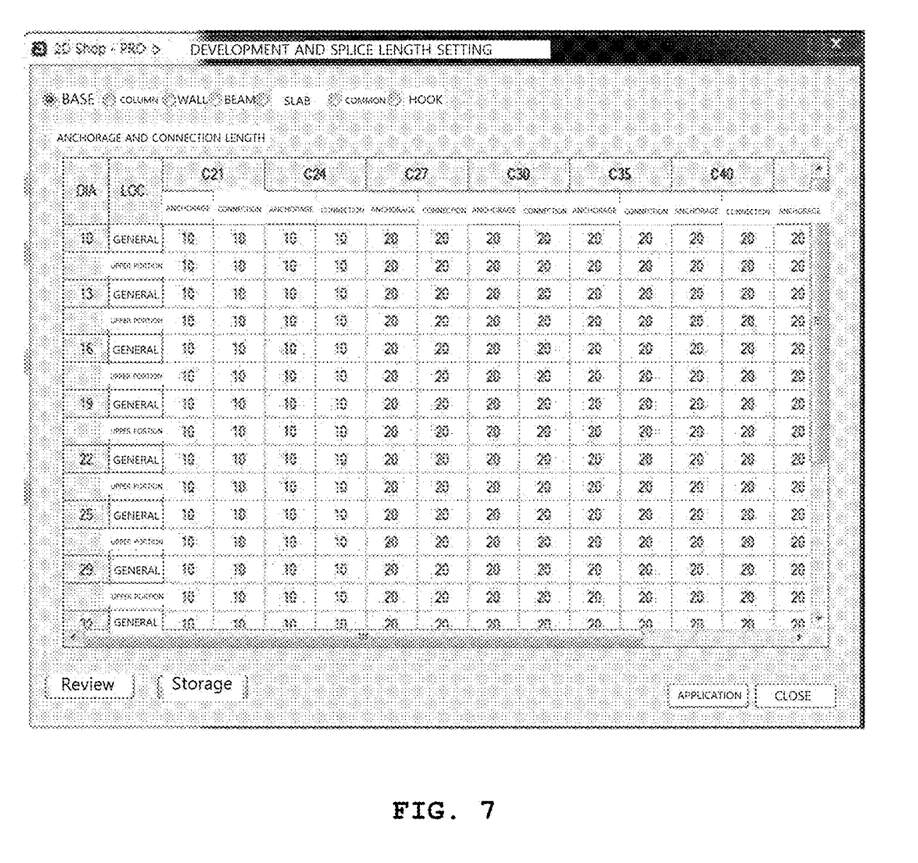
FIG. 7 is a diagram illustrating an example of an development and splice length setting option of a construction option setting unit.

FIG. 7 is a diagram illustrating an example of an development and splice length setting option of a construction option setting unit.

The construction option setting unit 61 may include an development and splice length setting option configured to set an development and splice length by member groups to be reflected on the rebar shop drawing data 6.

As shown in FIG. 7, through the development and splice length setting option, the development and splice length by member groups, and a bending angle of a hook may be set by member groups. Accordingly, the length of the rebar may be adjusted to be reflected on the rebar shop drawing data 6.

Figure 8:
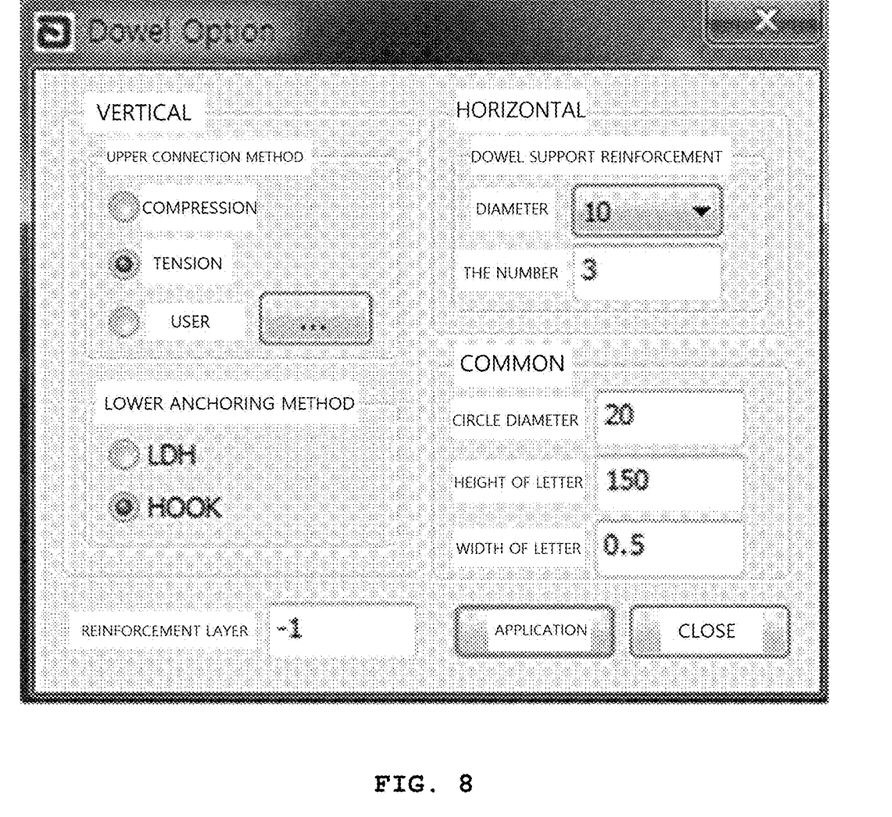
FIG. 8 is a diagram illustrating an example of a dowel setting option of a construction option setting unit.

FIG. 8 is a diagram illustrating an example of a dowel setting option of a construction option setting unit.

The construction option setting unit 61 may include a dowel setting option configured to set a dowel anchoring method of a vertical member to be reflected on the rebar shop drawing data 6.

Accordingly, as shown in FIG. 8, through the dowel setting option, options such as a connecting method of an upper portion of a dowel, an anchoring method of the dowel, and horizontal dowel support reinforcement may be selected. Accordingly, the length of the rebar may be adjusted to be reflected on the rebar shop drawing data 6.

Figure 9:
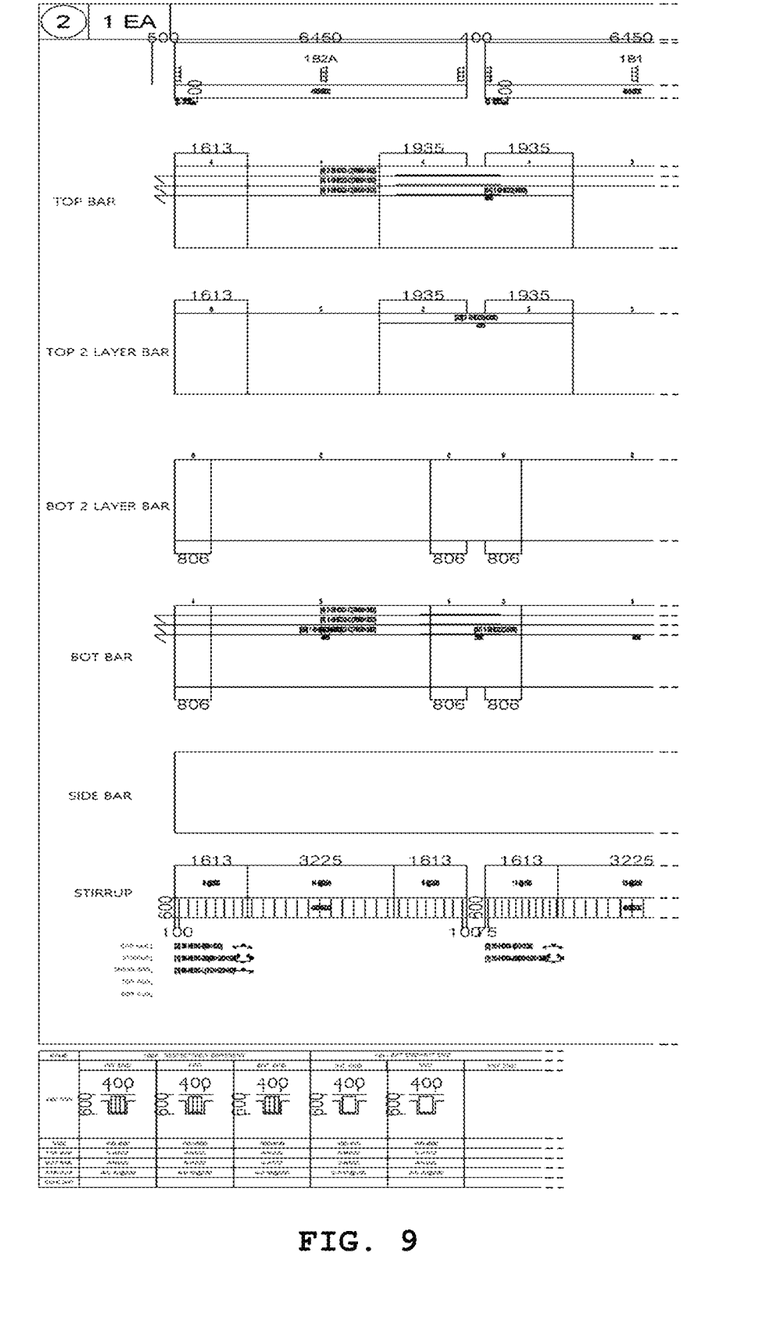
FIG. 9 is an example of a rebar shop drawing with respect to a beam.
Figure 10:
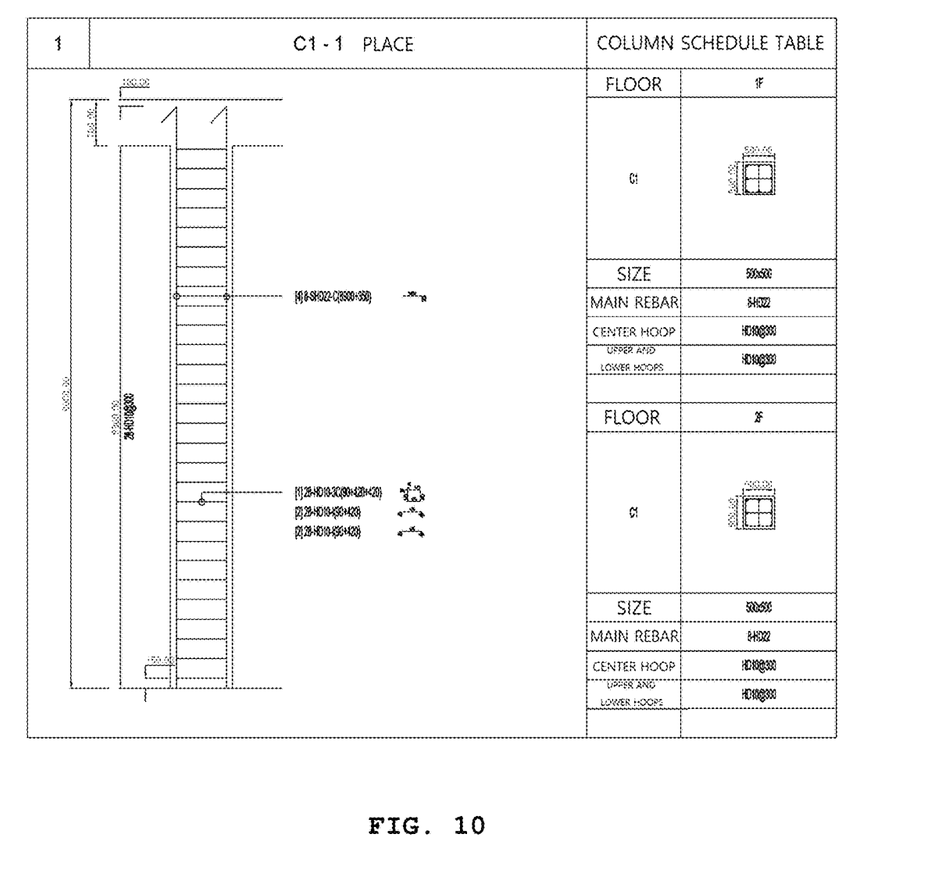
FIG. 10 is an example of a rebar shop drawing with respect to a column.
Figure 11:
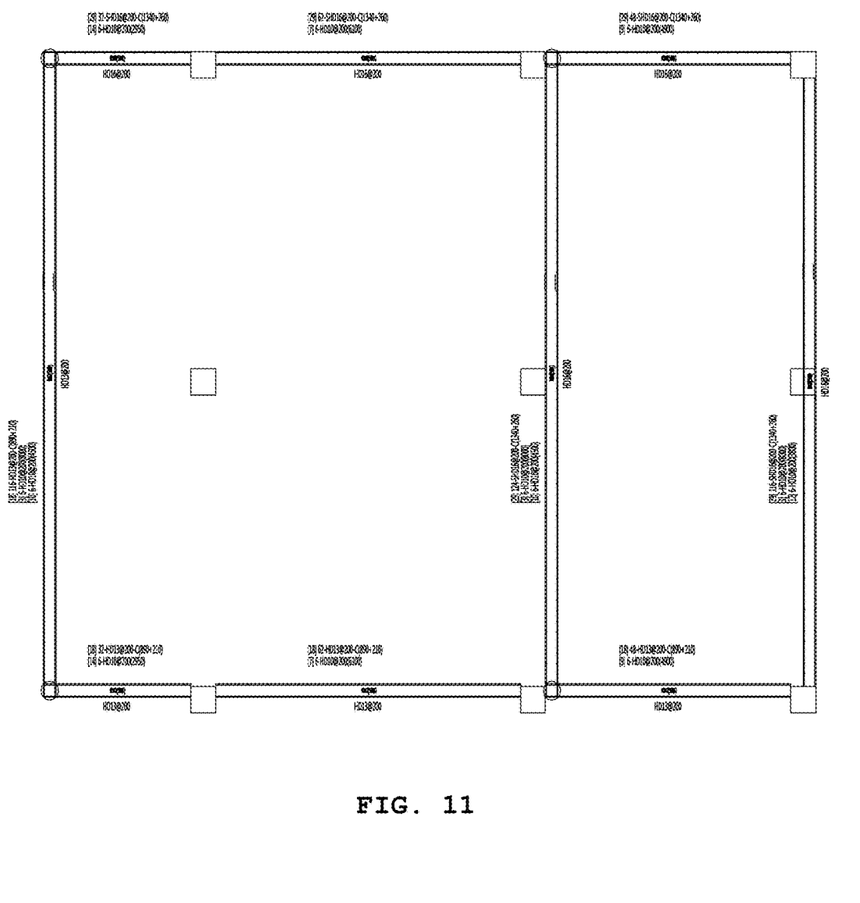
FIG. 11 is an example of a rebar shop drawing with respect to a wall.

FIG. 9 is an example of a rebar shop drawing with respect to a beam, FIG. 10 is an example of a rebar shop drawing with respect to a column, and FIG. 11 is an example of a rebar shop drawing with respect to a wall.

FIG. 9 to FIG. 11 are exemplary diagrams illustrating rebar shop drawings with respect to a beam, a column, and a wall created through the automatic generation system of a rebar shop drawing using a 3D model according to the present invention, respectively.

As illustrated in FIG. 9 to FIG. 11, when the present invention is used, the 2D rebar shop drawing including boundary region reinforcement information as well as member reinforcement information may be acquired.

INDUSTRIAL APPLICABILITY

The present invention can rapidly create a 2D rebar shop drawing including boundary region reinforcement information as well as member reinforcement information from the 2D structure drawing by matching adjacent member information and boundary region information with an adjacent member with each member in the 2D structure drawing after automatically extracting adjacent member information of each member from the 3D drawing by modeling the 2D structure drawing as a 3D drawing. When a design is changed, a reinforcement state of the whole building can be simply corrected.

What is claimed is:

1. An automatic generation system of a rebar shop drawing using a three-dimensional (3D) model, the system comprising:
   a structure drawing processor configured to receive two-dimensional (2D) structure drawing data where a member group is applied for every member;
   a member information processor configured to extract section information by member groups from member schedule data including section information and member reinforcement information of each member group and boundary region reinforcement information of each boundary region group by receiving the member schedule data;
   a 3D modeling processor configured to match the section information by members extracted from the member information processor with each member of the 2D structure drawing data received by the structure drawing processor to obtain a modeled 3D drawing;
   a boundary region information processor configured to extract boundary region information of each member from the modeled 3D drawing from the 3D modeling processor;
   a boundary region information matching processor configured to match the extracted boundary region information of each member from the boundary region information processor with each member of the 2D structure drawing data to allocate the matching result;
   a reinforcement information processor configured to generate rebar shop drawing data by matching the member reinforcement information of each member group and the boundary region reinforcement information of each boundary region group from the member schedule data with each member to which boundary region information of the 2D structure drawing data is allocated; and
   a rebar shop drawing processor configured to create and display a rebar shop drawing of a member selected by a user from the 2D structure drawing data storing reinforcement information of a member and a boundary region by the reinforcement information processor.

2. The automatic generation system of a rebar shop drawing using a 3D model of claim 1, wherein the reinforcement information processor comprises a rebar division setting option having a color changed according to a diameter of a rebar.

3. The automatic generation system of a rebar shop drawing using a 3D model of claim 1, wherein the reinforcement information processor comprises a construction option setting processor configured to control a length of a rebar.

4. The automatic generation system of a rebar shop drawing using a 3D model of claim 3, wherein the construction option setting processor comprises an order length setting option capable of setting an order length by diameters and yield strengths of the rebar.

5. The automatic generation system of a rebar shop drawing using a 3D model of claim 3, wherein the construction option setting processor comprises a modified length setting option for modifying a length of the rebar as a standardized length.

6. The automatic generation system of a rebar shop drawing using a 3D model of claim 3, wherein the construction option setting processor comprises a coating thickness setting option by setting a coating thickness by member groups to be reflected on the rebar shop drawing data.

7. The automatic generation system of a rebar shop drawing using a 3D model of claim 3, wherein the construction option setting processor comprises an development and splice length setting option configured to set an development and splice length by member groups to be reflected on the rebar shop drawing data.

8. The automatic generation system of a rebar shop drawing using a 3D model of claim 3, wherein the construction option setting processor comprises a dowel setting option configured to set a dowel anchoring method of a vertical member to be reflected on the rebar shop drawing data.

9. The automatic generation system of a rebar shop drawing using a 3D model of claim 1, wherein the reinforcement information processor comprises a reinforcement option setting processor configured to control a shape of a rebar.

10. The automatic generation system of a rebar shop drawing using a 3D model of claim 9, wherein the reinforcement option setting processor comprises a splice scheme setting option configured to set a rebar splice scheme to be reflected on the rebar shop drawing data.

11. The automatic generation system of a rebar shop drawing using a 3D model of claim 9, wherein the reinforcement option setting processor comprises an anchorage scheme setting option configured to set a rebar anchoring scheme to be reflected on the rebar shop drawing data.

12. The automatic generation system of a rebar shop drawing using a 3D model of claim 9, wherein the reinforcement option setting processor comprises a hoop shape setting option configured to set a column hoop shape bonded to the beam to be reflected on the rebar shop drawing data.

13. An automatic generation system of a rebar shop drawing using a three-dimensional (3D) model, the system comprising:
   a boundary region information processor configured to receive 3D building information modeling (BIM) data to extract boundary region information of each member from the 3D BIM data;
   a boundary region information matching processor configured to match the extracted boundary region information of each member from the boundary region information processor with each member of two-dimensional (2D) structure drawing data where a member group is applied for every member to allocate the matching result;
   a reinforcement information processor configured to create rebar shop drawing data by matching the member reinforcement information of each member group and the boundary region reinforcement information of each boundary region group from the member schedule data including section information and member reinforcement information of each member group and boundary region reinforcement information of each boundary region group with each member to which the boundary region information of the 2D structure drawing data is allocated; and
   a rebar shop drawing processor configured to create and display a rebar shop drawing of a member selected by a user from the 2D structure drawing data storing reinforcement information of a member and a boundary region by the reinforcement information processor.

14. The automatic generation system of a rebar shop drawing using a 3D model of claim 13, wherein the reinforcement information processor comprises a rebar division setting option having a color changed according to a diameter of a rebar.

15. The automatic generation system of a rebar shop drawing using a 3D model of claim 13, wherein the reinforcement information processor comprises a construction option setting processor configured to control a length of a rebar.

16. The automatic generation system of a rebar shop drawing using a 3D model of claim 15, wherein the construction option setting processor comprises an order length setting option capable of setting an order length by diameters and yield strengths of the rebar.

17. The automatic generation system of a rebar shop drawing using a 3D model of claim 15, wherein the construction option setting processor comprises a modified length setting option for modifying a length of the rebar as a standardized length.

18. The automatic generation system of a rebar shop drawing using a 3D model of claim 15, wherein the construction option setting processor comprises a coating thickness setting option by setting a coating thickness by member groups to be reflected on the rebar shop drawing data.

19. The automatic generation system of a rebar shop drawing using a 3D model of claim 15, wherein the construction option setting processor comprises an development and splice length setting option configured to set an development and splice length by member groups to be reflected on the rebar shop drawing data.

20. The automatic generation system of a rebar shop drawing using a 3D model of claim 15, wherein the construction option setting processor comprises a dowel setting option configured to set a dowel anchoring method of a vertical member to be reflected on the rebar shop drawing data.

21. The automatic generation system of a rebar shop drawing using a 3D model of claim 13, wherein the reinforcement information processor comprises a reinforcement option setting processor configured to control a shape of a rebar.

22. The automatic generation system of a rebar shop drawing using a 3D model of claim 21, wherein the reinforcement option setting processor comprises a splice scheme setting option configured to set a rebar splice scheme to be reflected on the rebar shop drawing data.

23. The automatic generation system of a rebar shop drawing using a 3D model of claim 21, wherein the reinforcement option setting processor comprises an anchorage scheme setting option configured to set a rebar anchoring scheme to be reflected on the rebar shop drawing data.

24. The automatic generation system of a rebar shop drawing using a 3D model of claim 21, wherein the reinforcement option setting processor comprises a hoop shape setting option configured to set a column hoop shape bonded to the beam to be reflected on the rebar shop drawing data.

* * * * *